(12) United States Patent
Lin et al.

(10) Patent No.: US 9,087,840 B2
(45) Date of Patent: Jul. 21, 2015

(54) SLOT-SHIELDED COPLANAR STRIP-LINE COMPATIBLE WITH CMOS PROCESSES

(75) Inventors: Yu-Ling Lin, Taipei (TW);
Hsiao-Tsung Yen, Tainan (TW);
Ho-Hsiang Chen, Hsin-Chu (TW);
Chin-Wei Kuo, Zhubei (TW);
Chewn-Pu Jou, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 693 days.

(21) Appl. No.: 12/917,285

(22) Filed: Nov. 1, 2010

(65) Prior Publication Data
US 2012/0104575 A1    May 3, 2012

(51) Int. Cl.
| H01L 23/14 | (2006.01) |
| H01L 23/522 | (2006.01) |
| H01L 23/66 | (2006.01) |
| H01L 27/06 | (2006.01) |

(52) U.S. Cl.
CPC ............ *H01L 23/5225* (2013.01); *H01L 23/66* (2013.01); *H01L 27/0629* (2013.01); *H01L 2223/6627* (2013.01); *H01L 2924/0002* (2013.01)

(58) Field of Classification Search
None
See application file for complete search history.

(56) References Cited

U.S. PATENT DOCUMENTS

| 6,614,325 B1 | 9/2003 | Kocin | |
| 7,145,411 B1* | 12/2006 | Blair et al. | 333/5 |
| 8,358,009 B2* | 1/2013 | Furumiya et al. | 257/758 |
| 2004/0155728 A1* | 8/2004 | Cheung et al. | 333/161 |
| 2007/0241844 A1* | 10/2007 | Kim et al. | 333/238 |
| 2009/0249610 A1* | 10/2009 | Ding et al. | 29/600 |

OTHER PUBLICATIONS

Nomiyama, Y. et al., "Low-Impedance and High-Q Transmission Line for mmw VCO," IEEE 2009, 4 pgs, Department of Physical Electronics, Tokyo Institute of Technology.
Veenstra, H. et al., "60GHz VCOs with transmission line resonator in a 0.25μm SiGe BiCMOS technology,". IEEE Radio Frequency Integrated Circuits Symposium, 2008, pp. 119-122, Philips Research, Eindhoven, The Netherlands.

* cited by examiner

*Primary Examiner* — Matthew W Such
*Assistant Examiner* — Abul Kalam
(74) *Attorney, Agent, or Firm* — Slater & Matsil, L.L.P.

(57) ABSTRACT

A strip-line includes a ground plane extending through a plurality of dielectric layers over a substrate; a signal line over the substrate and on a side of the ground plane; a first plurality of metal strips under the signal line and in a first metal layer, wherein the first plurality of metal strips is parallel to each other, and is spaced apart from each other by spaces; and a second plurality of metal strips under the signal line and in a second metal layer over the first metal layer. The second plurality of metal strips vertically overlaps the spaces. The first plurality of metal strips is electrically coupled to the second plurality of metal strips through the ground plane, and no via physically contacts the first plurality of metal strips and the second plurality of metal strips.

12 Claims, 4 Drawing Sheets

SLOT-SHIELDED COPLANAR STRIP-LINE COMPATIBLE WITH CMOS PROCESSES

BACKGROUND

Transmission lines are important elements in microwave circuit applications. Transmission lines provide the interconnection between active and passive devices of microwave circuits, and are utilized as impedance matching elements as well. A strip-line is a type of transmission line widely utilized in monolithic microwave integrated circuit (MMIC) applications.

Strip-lines have a number of advantages when utilized in MMIC applications. First of all, since microstrip-lines are formed of conductive planes disposed on substrates, they are readily adaptable to the manufacturing process of the integrated circuits. Accordingly, strip-lines may be integrated on a same substrate with commonly used integrated circuits such as complementary metal-oxide-semiconductor (CMOS) circuits.

In a conventional grounded coplanar wave-guide (GCPW), which is a type of strip-line, a signal line is shielded from the underlying substrate by a grounded metal plane that is inserted between the substrate and the signal line. It is realized that even if the signal line is formed in the top metal layer of the respective chip, the distance between the signal line and the grounded metal plane is still very small. Accordingly, the capacitance between the signal line and the grounded metal plane is small. The characteristic impedance of the GCPW, which characteristic impedance is proportional to a square root of a quotient of an inductance of the GCPW to the capacitance, is also small. However, the GCPW needs to have a characteristic impedance matching the characteristic impedance of the connecting devices. This requires that either the width of the signal line is reduced, or the spacing between the signal line and the grounded metal plane is increased. Since the spacing is limited by the distance between the top metal layer and the substrate, the width of the metal line has to be very small, which not only incurs process difficulty, but also results in the resistance of the signal line to be adversely increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel slot-shielded coplanar strip-line (CPS) is provided in accordance with an embodiment. Variations of the embodiment are discussed. Throughout the various views and illustrative embodiments, like reference numbers are used to designate like elements.

Figure 1A:
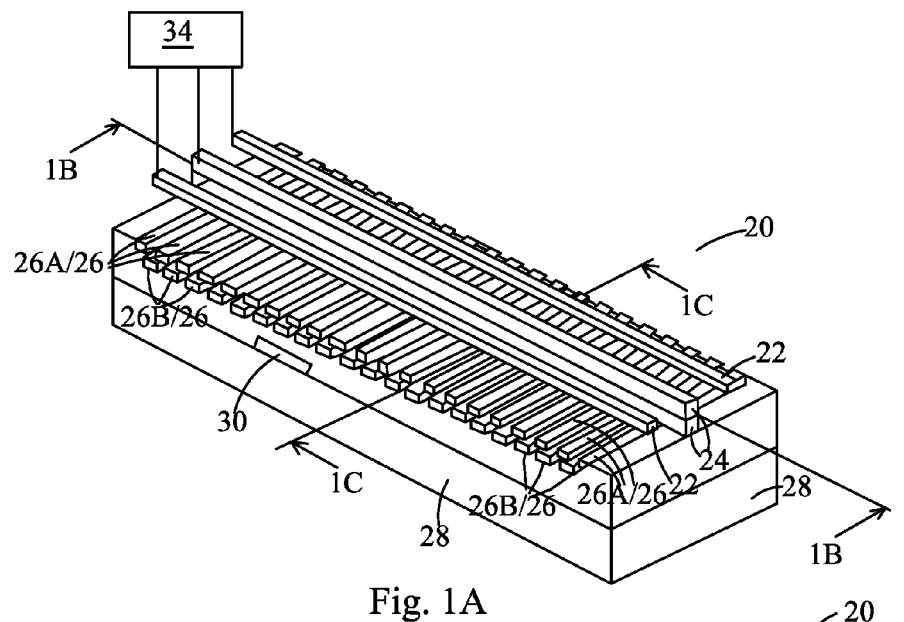
FIG. 1A illustrates perspective view of a slot-shielded coplanar strip-line in accordance with an embodiment.

FIG. 1A illustrates a perspective view of slot-shielded CPS 20 in accordance with an embodiment. Slot-shielded CPS 20, which includes one or two signal line 22, ground plane 24, and ground metal strips 26 (including 26A and 26B), is formed over substrate 28. In an embodiment, substrate 28 is a semiconductor substrate, and may include commonly used semiconductor materials such as silicon, germanium, and the like. Substrate 28 may also be formed of dielectric materials such as glass, or formed of high-resistance materials that have the resistivities between that of semiconductor materials and dielectric materials. The structure shown in FIG. 1A may be a portion of a semiconductor chip. Integrated circuit 30, which may include complementary metal-oxide-semiconductor (CMOS) devices (not shown), may be formed at the surface of substrate 28. Accordingly, the process for forming slot-shielded CPS 20 may be part of the CMOS process. Microwave device 34, such as a coplanar waveguide (CPW), a grounded coplanar waveguide (GCPW), a coplanar strip line (CPS), a strip line, a MOSFET, a MOS capacitor, inductor, capacitor, resistor, or the like, may be connected to signal line 22 and ground plane 24. In FIG. 1A, although ground plane 24 is shown as having two layers, it may include more than two layers. Signal lines 22 and ground metal strips 26 are also formed in dielectric layers 32 (not shown in FIG. 1A, please refer to FIG. 1B), which may be inter-metal dielectric (IMD) layers. The materials of dielectric layers 32 may be low-k dielectric materials, which have k values lower than about 3.0, for example.

Figure 1B:
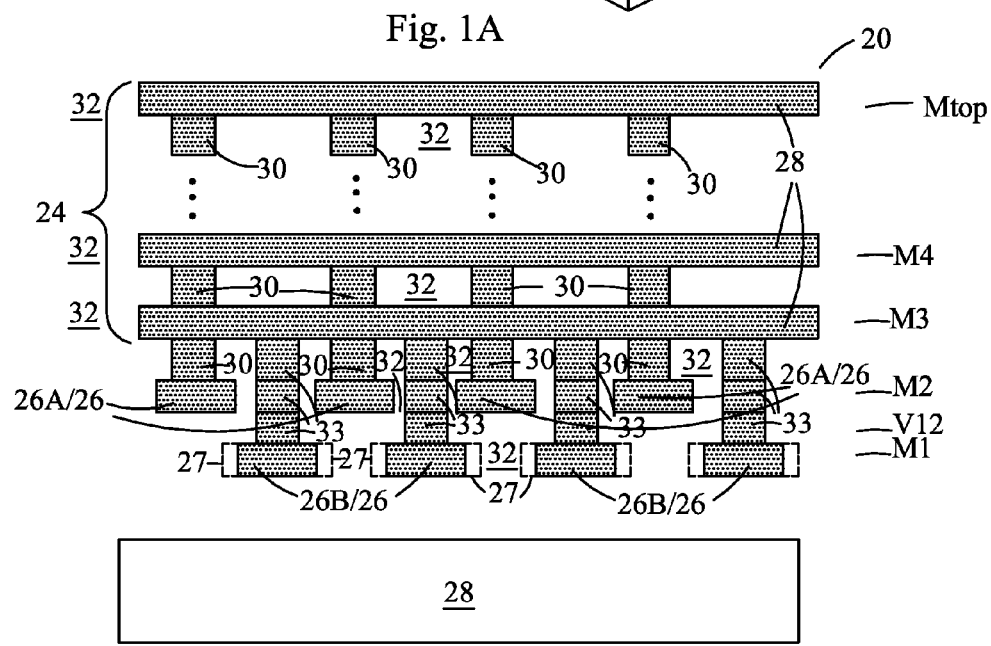
FIGS. 1B and 1C illustrate cross-sectional views of the structure shown in FIG. 1A.

FIG. 1B illustrates a cross-sectional view of the structure shown in FIG. 1A, wherein the cross-sectional view is taken along a vertical plane crossing line 1B-1B in FIG. 1A. Ground plane 24 may be grounded. In an embodiment, ground plane 24 is formed in a plurality of metal layers, including the third metal layer from bottom (commonly known as M3), top metal layer Mtop, and metal layers therebetween such as metal layer M4. In alternative embodiments, the bottom layer of ground plane 24 may be higher than metal layer M3. Ground plane 24 includes metal lines 28 in the plurality of metal layers, and vias 30 interconnecting metal lines. Metal lines 28 and vias 30 are in dielectric layers 32. In an embodiment, vias 30 are discrete vias, as shown in FIG. 1B. In alternative embodiments, vias have substantially same length (in the extending direction of signal line 22 as in FIG. 1A), and hence ground plane 24 is a solid metal wall. Signal line 22, ground plane 24, and ground metal strips 26 may be formed using commonly known damascene processes, and may be formed of copper or copper alloys.

Ground metal strips 26 (including 26A and 26B) are formed under ground plane 24, and may be electrically connected to ground plane 24. In embodiments, ground metal strips 26A are formed in metal layer M2, while ground metal strips 26B are formed in metal layer M1, although they can also be formed in metal layers higher than M1 and M2. Accordingly, ground metal strips 26 and ground metal strips 26 may be grounded. Each of ground metal strips 26A may be connected to ground plane 24 through vias 30, and each of ground metal strips 26B may be connected to ground plane 24 through metal pads/vias 33. In an embodiment, metal pads/vias 33 are spaced apart from ground metal strips 26A by dielectric layer 32. No via in layer V12, which is the via layer between metal layers M1 and M2, directly connects ground metal strips 26A to ground metal strips 26B. In other words, ground metal strips 26A and ground metal strips 26B are physically disconnected from each other. Ground metal strips 26B vertically overlap the spaces between ground metal strips 26A, and ground metal strips 26A vertically overlap the spaces between ground metal strips 26B. If viewed in a top view, as shown in FIG. 1D, ground metal strips 26B fully overlap the spaces between ground metal strips 26A, and in the rectangular region defined by ground metal strips 26, no part of substrate 28 may be seen through the spaces between ground metal strips 26.

Referring back to FIG. 1B, the edges of ground metal strips 26A, which may be formed in metal layer M1, may be vertically aligned to the edges of ground metal strips 26B, which may be formed in metal layer M1. Alternatively, as shown as dotted edges 27, ground metal strips 26A may have edge portions vertically overlapping edge portions of ground metal strips 26B. However, the center portions of ground metal strips 26A may not overlap center portions of ground metal strips 26B.

Figure 1C:
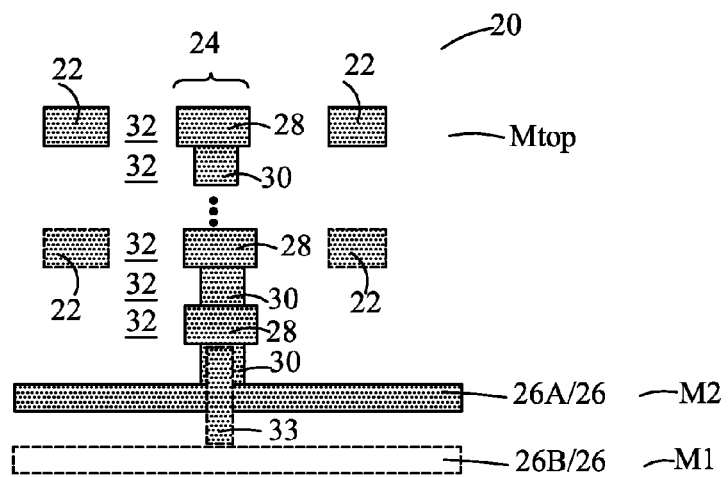

FIG. 1C illustrates a cross-sectional view of the structure shown in FIG. 1A, wherein the cross-sectional view is taken along a vertical plane crossing line 1C-1C in FIG. 1A. In an embodiment, signal lines 22 are formed in top metal layer Mtop, although it may also be formed in any of the underlying layers that are higher than the metal layer in which ground metal strips 26A are located. The dotted signal lines 22 illustrate the alternative positions of signal lines 22.

Figure 1D:
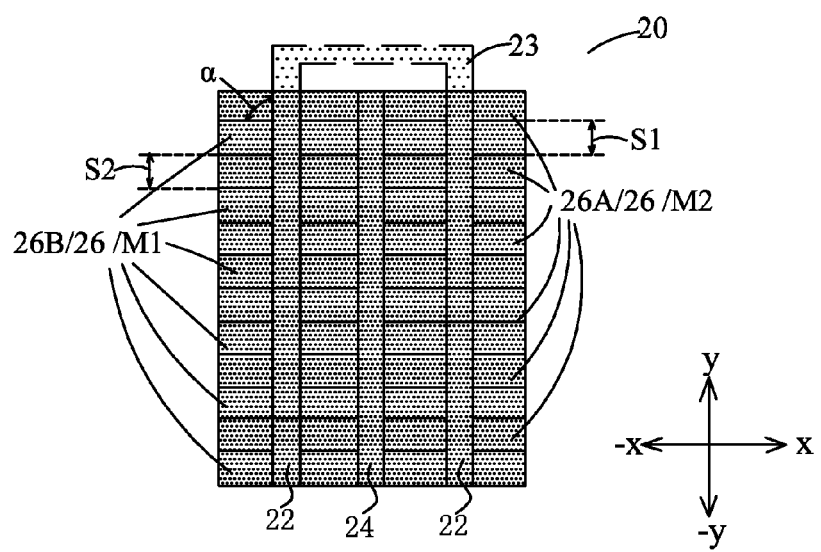
FIG. 1D illustrates a top view of the structure shown in FIG. 1A.

FIG. 1D illustrates a top view of the structure shown in FIG. 1A. In an embodiment, the longitudinal direction (for example, x directions) of ground metal strips 26 is perpendicular to the longitudinal direction of signal lines 22 (for example, y directions), with the angle α being 90 degrees. Alternatively, angle α may have other non-zero values smaller than or greater than 90 degrees. A longitudinal direction of ground plane 24 may be parallel to, or at least substantially parallel to, the longitudinal direction of signal lines 22, which longitudinal directions are marked as y directions.

The numbers ground metal strips 26A and ground metal strips 26B may be greater than about 2, or even greater than about 4. In an embodiment, ground metal strips 26A and/or ground metal strips 26B are placed with an alternating pattern. For example, ground metal strips 26A and ground metal strips 26A may be equally spaced. In alternative embodiments, the spacing S1 between two neighboring ground metal strips 26A may be different from other spacing S2 between neighboring ground metal strips 26B.

Figure 2A:
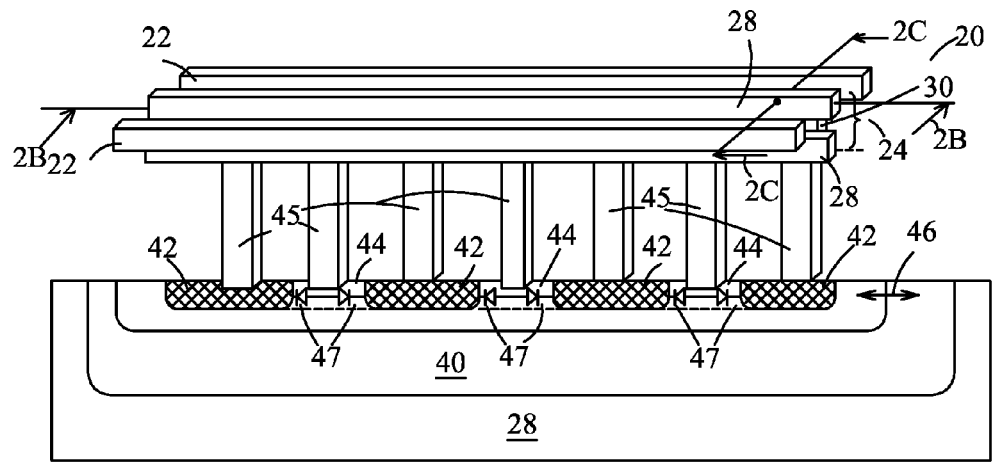
FIG. 2A illustrates perspective view of a slot-shielded coplanar strip-line in accordance with alternative embodiments.

FIGS. 2A through 2D illustrate alternative embodiments. Unless specified otherwise, the reference numerals in these embodiments represent like elements in the embodiments illustrated in FIGS. 1A through 1D. These embodiments are similar to the embodiments shown in FIGS. 1A through 1D, except that p-type and n-type well strips are formed in substrate 28 to replace ground metal strips 26. Further, ground plane 24 may extend to the bottom metal layer (M1), which is immediately over the inter-layer dielectric (ILD), in which contact plugs 45 are located. FIG. 2A illustrates a perspective view illustrating that n-well region 40 is formed in substrate 28, which may be a p-type substrate. Further, p-well strips 42 are formed in n-well region 40, and are spaced apart from each other by n-well region 40. The portions of n-well region 40 between p-well strips 42 are referred to as n-well strips 44 hereinafter, and p-well strips 42 and n-well strips 44 in combination are referred to as slot shields hereinafter. Each of p-well strips 42 and n-well strips 44 may be electrically coupled to ground plane 24 through contact plugs 45 (which may be formed of tungsten, for example). P-well strips 42 and n-well strips 44 in combination electrically shield signal lines 22 from substrate 28. It is noted that due to the back-to-back (and face-to-face) P-N junctions 47 formed between p-well strips 42 and n-well strips 44, no current can flow through p-well strips 42/n-well strips 44 and in the directions shown as arrows 46. Further, the distance between signal lines 22 and slot shields 42/44 is increased over the distance between signal lines 22 and ground metal strips 26, and the capacitance of the respective slot-shielded CPS 20 may be desirably reduced. In an embodiment, the concentrations of n-well region 40 and p-well strips 42 may be between about $10^{12}/cm^3$ and about $10^{14}/cm^3$, for example, although higher or lower concentrations may also be used. The thicknesses of n-well region 40 and p-well strips 42 may be between about 0.3 μm and about 3 μm, for example.

Figure 2B:
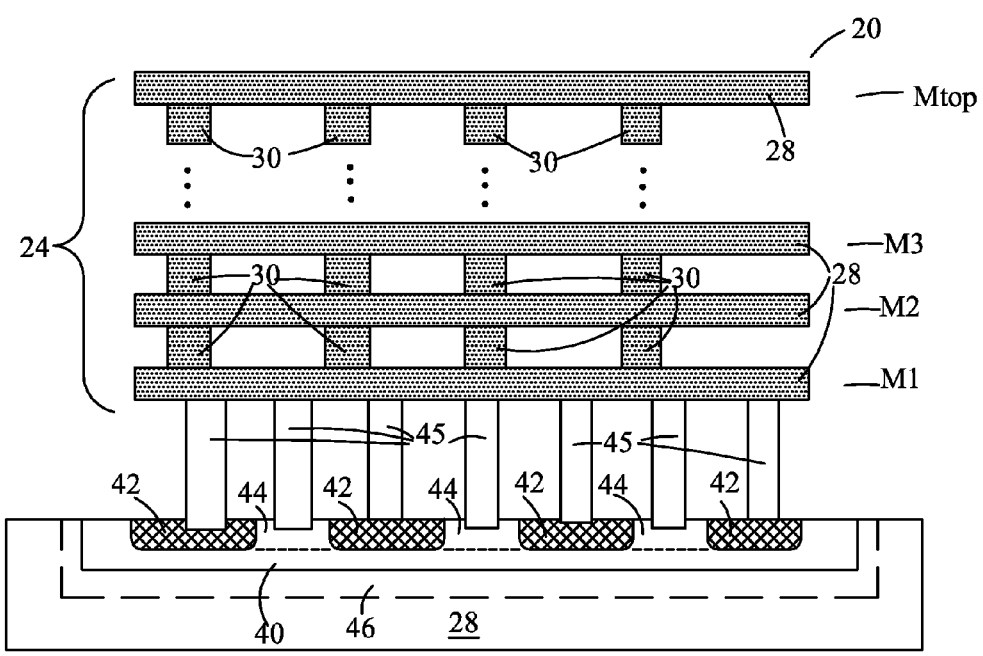
FIGS. 2B and 2C illustrate cross-sectional views of the structure shown in FIG. 2A.

FIG. 2B illustrates a cross-sectional view of the structure shown in FIG. 2A, wherein the cross-sectional view is taken along a vertical plane crossing line 2B-2B in FIG. 2A. It is observed that the slot shield 42/44 is electrically insulated from substrate 28 due to p-n junctions 47 between n-well 40 and substrate 28. In alternative embodiments, well regions 42 may be n-type, well region 40 may be p-type, and an additional n-well region 46 (illustrated with dotted line) may be added.

Figure 2C:
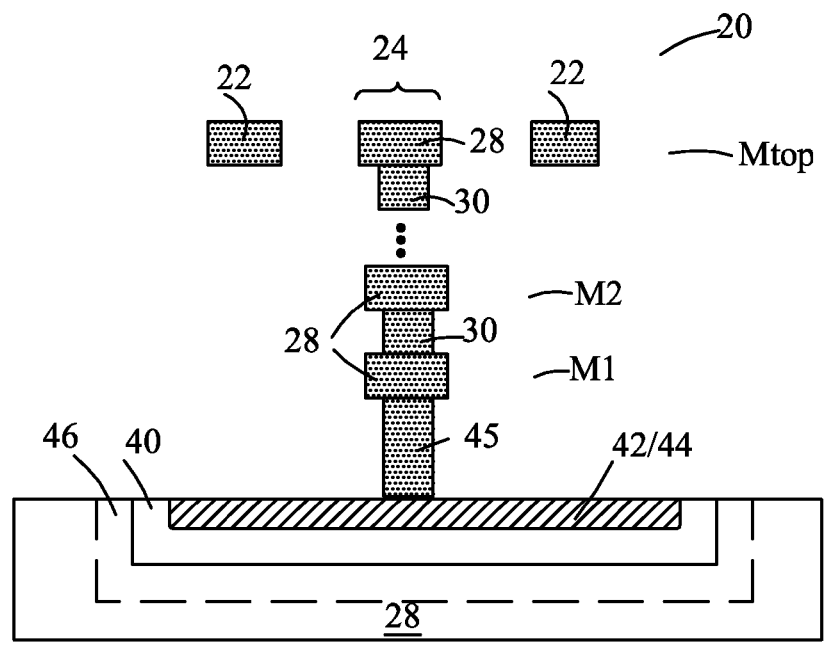
Figure 2D:
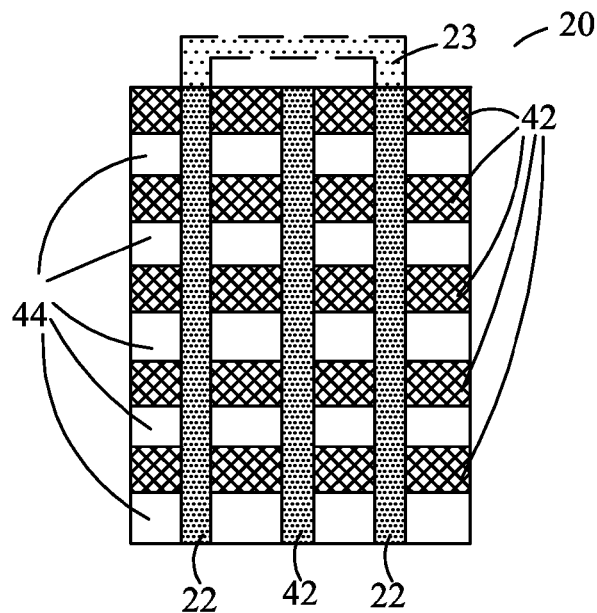
FIG. 2D illustrates a top view of the structure shown in FIG. 2A.

FIG. 2C illustrates a cross-sectional view of the structure shown in FIG. 2A, wherein the cross-sectional view is taken along a vertical plane crossing line 2C-2C in FIG. 2A. FIG. 2D illustrates a top view of slot-shielded CPS 20 as shown in FIG. 2A, and shows that slot shield 42/44 may form a rectangular region vertically overlapping both ground plane 24 and signal lines 22.

In an embodiment, slot-shielded CPS 20 includes a single signal line 22. In alternative embodiment, the signal lines 22 on opposite sides of ground plane 24 are differential signal lines for carrying differential signals. In yet other embodiments, as shown in FIGS. 1D and 2D, the signal lines 22 on opposite sides of ground plane 24 are interconnected through portion 23, and are used as a single signal line.

In the embodiments, signal lines 22 are shielded from substrate 28 by slot shields 26 or 42/44. Since no current can flow in the directions of arrows 46 in FIGS. 1B and 2A and through slot shields 26 or 42/44, the mutual inductance of slot-shielded CPS 20 may be reduced, and the inductance of slot-shielded CPS 20 is increased. This results in an increase in the characteristic impedance of slot-shielded CPS 20, which means that the width of signal lines 22 can be increased without causing the characteristic impedance to be too small. Further, the spacing between signal lines 22 and the ground (ground plane 24) is in horizontal directions parallel to the top surface of substrate 28, and hence there is more room to tune the spacing.

In accordance with embodiments, a strip-line includes a ground plane extending through a plurality of dielectric layers over a substrate; a signal line over the substrate and on a side of the ground plane; a first plurality of metal strips under the signal line and in a first metal layer, wherein the first plurality of metal strips is parallel to each other, and is spaced apart from each other by spaces; and a second plurality of metal strips under the signal line and in a second metal layer over the first metal layer. The second plurality of metal strips vertically overlaps the spaces. The first plurality of metal strips is electrically coupled to the second plurality of metal strips through the ground plane, and no via physically contacts the first plurality of metal strips and the second plurality of metal strips.

In accordance with other embodiments, a device includes a semiconductor substrate; a ground plane extending through a plurality of dielectric layers over the semiconductor substrate, and includes a plurality of metal lines in the plurality of dielectric layers, and vias between and interconnecting the plurality of metal lines, wherein the ground plane is grounded; a signal line on a side of the ground plane and parallel to the ground plane; a first plurality of metal strips under the signal line and the ground plane; and a second plurality of metal strips under the signal line and the ground plane. Each of the first and the second plurality of metal strips includes a first part vertically overlapping a part of the signal line, and a second part vertically overlapping a part of the ground plane. The first and the second plurality of metal strips are allocated in an alternating pattern in a top view of the first and the second plurality of metal strips.

In accordance with yet other embodiments, a device includes a semiconductor substrate; and a ground plane extending through a plurality of dielectric layers over the semiconductor substrate, and including a plurality of metal lines in the plurality of dielectric layers, and vias between and interconnecting the plurality of metal lines, wherein the ground plane is grounded. The device further includes a signal line over the semiconductor substrate and parallel to the ground plane; a first plurality of well strips of a first conductivity type in the semiconductor substrate; and a second well strip in the semiconductor substrate and spacing two of the first plurality of well strips apart from each other. The second well strip is of a second conductivity type opposite the first conductivity type. Each of the plurality of first p-well strips and the second well strip includes a first portion vertically overlapping a portion of the signal line and a second portion vertically overlapping a portion of the ground plane. The device further includes electrical connections electrically coupling the first plurality of well strips and the second well strip to the ground plane Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A device comprising:
a substrate; and
a strip-line comprising:
   a ground plane extending through a plurality of dielectric layers over the substrate, and comprising a plurality of metal lines in the plurality of dielectric layers, and vias between and interconnecting the plurality of metal lines;
   a first signal line over the substrate and on a side of the ground plane, wherein the first signal line has a first longitudinal direction parallel to a second longitudinal direction of the ground plane;
   a second signal line on an opposite side of the ground plane than the first signal line, wherein the first signal line and the second signal line are differential signal lines carrying differential signals;
   a first plurality of metal strips under the first signal line and the second signal line and in a first metal layer, wherein the first plurality of metal strips is parallel to each other, and is spaced apart from each other by spaces; and
   a second plurality of metal strips under the first signal line and the second signal line and in a second metal layer over the first metal layer, wherein the second plurality of metal strips vertically overlaps the spaces, wherein the first plurality of metal strips is electrically coupled to the second plurality of metal strips through the ground plane, and wherein no via physically contacts one of the first plurality of metal strips and one of the second plurality of metal strips.

2. The device of claim 1, wherein all of the spaces are fully overlapped by the second plurality of metal strips, with substantially no space left between the first and the second plurality of metal strips in a top view of the substrate.

3. The device of claim 1, wherein one of the first plurality of metal strips comprises an edge portion overlapping an edge portion of one of the second plurality of metal strips, and wherein a center portion of the one of the first plurality of metal strips is not overlapped with a center portion of the one of the second plurality of metal strips.

4. The device of claim 1 further comprising lower vias connecting a bottom of the ground plane to the first plurality of metal strips, wherein the lower vias are spaced apart from the second plurality of metal strips by a dielectric material.

5. The device of claim 1, wherein in a top view of the substrate, the first and the second plurality of metal strips occupy a rectangular region with substantially an entirety of the ground plane and substantially an entirety of the signal line in the rectangular region.

6. The device of claim 1, wherein the first metal layer is a bottom metal layer (M1), and wherein the second metal layer (M2) is immediately over the bottom metal layer.

7. A device comprising:
a semiconductor substrate;
a ground plane extending through a plurality of dielectric layers over the semiconductor substrate, and comprising a plurality of metal lines in the plurality of dielectric layers, and vias between and interconnecting the plurality of metal lines, wherein the ground plane is grounded;
a first signal line and a second signal line on opposite sides of the ground plane and parallel to the ground plane, wherein an end of the first signal line is connected to an end of the second signal line;
a first plurality of metal strips under both the first and second signal line and the ground plane; and
a second plurality of metal strips under both the first and second signal line and the ground plane, wherein each of the first and the second plurality of metal strips comprises a first part vertically overlapping a part of the first signal line, and a second part vertically overlapping a part of the ground plane, and wherein the first and the second plurality of metal strips are allocated in an alternating pattern in a top view of the first and the second plurality of metal strips, wherein the first and the second plurality of metal strips are electrically grounded.

8. The device of claim 7, wherein each of the first and the second plurality of metal strips are physically disconnected from each other with no via contacting any one of the first plurality of metal strips and any one of the second plurality of metal strips.

9. The device of claim 7, wherein in the top view of the first and the second plurality of metal strips, the first and the second plurality of metal strips form a rectangular region.

10. The device of claim 7, wherein in the top view of the first and the second plurality of metal strips, substantially no space between the first plurality of metal strips is not vertically overlapped by the second plurality of metal strips.

11. The device of claim 7, wherein the first and the second plurality of metal strips are in different metal layers.

12. The device of claim 7, wherein longitudinal directions of the first and the second plurality of metal strips are perpendicular to longitudinal directions of the signal line and the ground plane.

* * * * *